(12) United States Patent
Cheng

(10) Patent No.: US 9,077,788 B2
(45) Date of Patent: Jul. 7, 2015

(54) ELECTRONIC APPARATUS

(71) Applicant: COMPAL ELECTRONICS, INC., Taipei (TW)

(72) Inventor: Hsien-Hung Cheng, Taipei (TW)

(73) Assignee: COMPAL ELECTRONICS, INC., New Taipei (TW)

( * ) Notice: Subject to any disclaimer, the term of this patent is extended or adjusted under 35 U.S.C. 154(b) by 170 days.

(21) Appl. No.: 13/948,908

(22) Filed: Jul. 23, 2013

(65) Prior Publication Data

US 2014/0139086 A1   May 22, 2014

Related U.S. Application Data

(60) Provisional application No. 61/728,769, filed on Nov. 20, 2012.

(51) Int. Cl.
*G02F 1/1333* (2006.01)
*H04M 1/02* (2006.01)
*H05K 5/00* (2006.01)
*G06F 1/16* (2006.01)

(52) U.S. Cl.
CPC ....... *H04M 1/0249* (2013.01); *G02F 1/133308* (2013.01); *H05K 5/0013* (2013.01); *G06F 1/162* (2013.01); *G06F 1/1637* (2013.01); *G06F 1/1643* (2013.01)

(58) Field of Classification Search
CPC ............ G02F 1/1333; G02F 1/133308; G02F 1/13306; G02F 2001/133322; G02F 2001/133342
USPC .......................................................... 349/58
See application file for complete search history.

(56) References Cited

U.S. PATENT DOCUMENTS 6,995,813 B2 * 2/2006 Shin ................................ 349/58
2012/0174449 A1 * 7/2012 Pitcher et al. ............... 40/606.01

FOREIGN PATENT DOCUMENTS

TW       534345       5/2003
TW       543812       7/2003

* cited by examiner

*Primary Examiner* — Nathanael R Briggs
(74) *Attorney, Agent, or Firm* — Muncy, Geissler, Olds & Lowe, P.C.

(57) ABSTRACT

An electronic apparatus includes a frame, at least one first blocking part, at least one second blocking part, a display module, a first wedging structure and a second wedging structure. The frame includes a first frame stick, a second frame stick and a third frame stick connecting the first frame stick and the second frame stick. The first blocking part is disposed on the first frame stick. The second blocking part is disposed on the second frame stick. The display module includes a first edge, a second edge and at least one third edge. The third edge is pivotally connected to the third frame stick. The first and second wedging structures are respectively disposed on the first and second edges for wedging the first blocking part or the second blocking part. The first wedging structure and the second wedging structure are misaligned.

14 Claims, 16 Drawing Sheets

ELECTRONIC APPARATUS

RELATED APPLICATIONS

This application claims priority to U.S. Provisional Application Ser. No. 61/728/769, filed Nov. 20, 2012, which is herein incorporated by reference.

BACKGROUND

1. Technical Field

Embodiments of the present invention relate to an electronic apparatus. More particularly, embodiments of the present invention relate to an electronic apparatus having a rotatable display panel.

2. Description of Related Art

With the development of the technology, a liquid crystal display (LCD) has become one of the most popular display devices. The LCD includes a frame and a display module. Typically, the display module is fixed in the frame and cannot rotate freely.

To allow the user to watch the screen in various positions, a rotatable LCD is developed. In the rotatable LCD, opposite edges of the display module are pivotally connected to the frame. As such, the display module can rotate relative to the frame to facilitate the user watching the screen from various positions.

The frame of the rotatable LCD requires a hook to temporality fasten the display module after the display module rotates. However, the hook increases the thickness of the frame, which violates the miniaturization trends of the electronic product.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An electronic apparatus is provided, in which the apparatus includes a rotatable display module, and the frame doesn't require the hook, so as to facilitate the miniaturization of the electronic apparatus.

In accordance with one embodiment of the present invention, an electronic apparatus includes a frame, at least one first blocking part, at least one second blocking part, a display module, a first wedging structure and a second wedging structure. The frame includes a first frame stick, a second frame stick and at least one third frame stick connecting the first frame stick and the second frame stick. The first blocking part is disposed on the first frame stick. The second blocking part is disposed on the second frame stick. The display module includes a first edge, a second edge and at least one third edge. The third edge is pivotally connected to the third frame stick. The first wedging structure is disposed on the first edge for wedging the first blocking part or the second blocking part. The first wedging structure and the third edge define a first distance therebetween. The second wedging structure is disposed on the second edge of the display module for wedging the first blocking part or the second blocking part. The second wedging structure and the third edge define a second distance therebetween. The first distance is different from the second distance.

In the foregoing embodiment, because only the blocking part is concave on the frame stick, and the wedging structure is disposed on the edge of the display module, so that the thickness of the frame stick can be reduced, thereby facilitating the miniaturization of the electronic apparatus.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
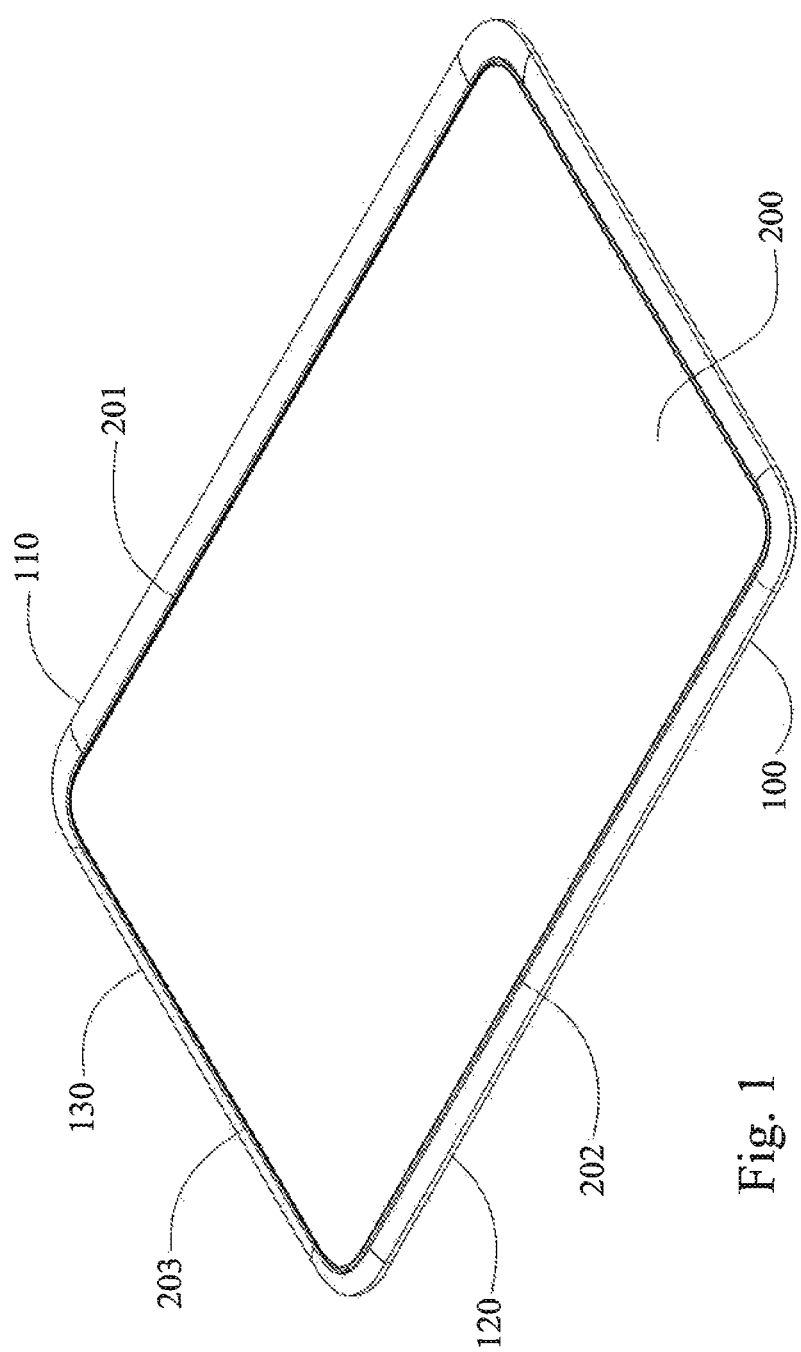
FIG. 1 is a perspective view of an electronic apparatus in accordance with one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a perspective view of an electronic apparatus in accordance with one embodiment of the present invention. As shown in FIG. 1, in this embodiment, the electronic apparatus includes a frame 100 and a display module 200. The display module 200 is encompassed the frame 100. The frame 100 includes a first frame stick 110, a second frame stick 120 and at least one third frame stick 130. The third frame stick 130 connects the first frame stick 110 and the second frame stick 120. The display module 200 includes a first edge 201, a second edge 202 and at least one third edge 203. The first edge 201, the second edge 202, the first frame stick 110 and the second frame stick 120 are parallel. The third edge 203 is pivotally connected to the third frame stick 130, which enables the display module 200 to rotate relative to the frame 100, so that the first edge 201 can adjoin the first frame stick 110 and the second edge 202 can adjoin the second frame stick 120, or alternatively, the first edge 201 can adjoin the second frame stick 120 and the first edge 202 can adjoin the first frame stick 110.

Figure 2:
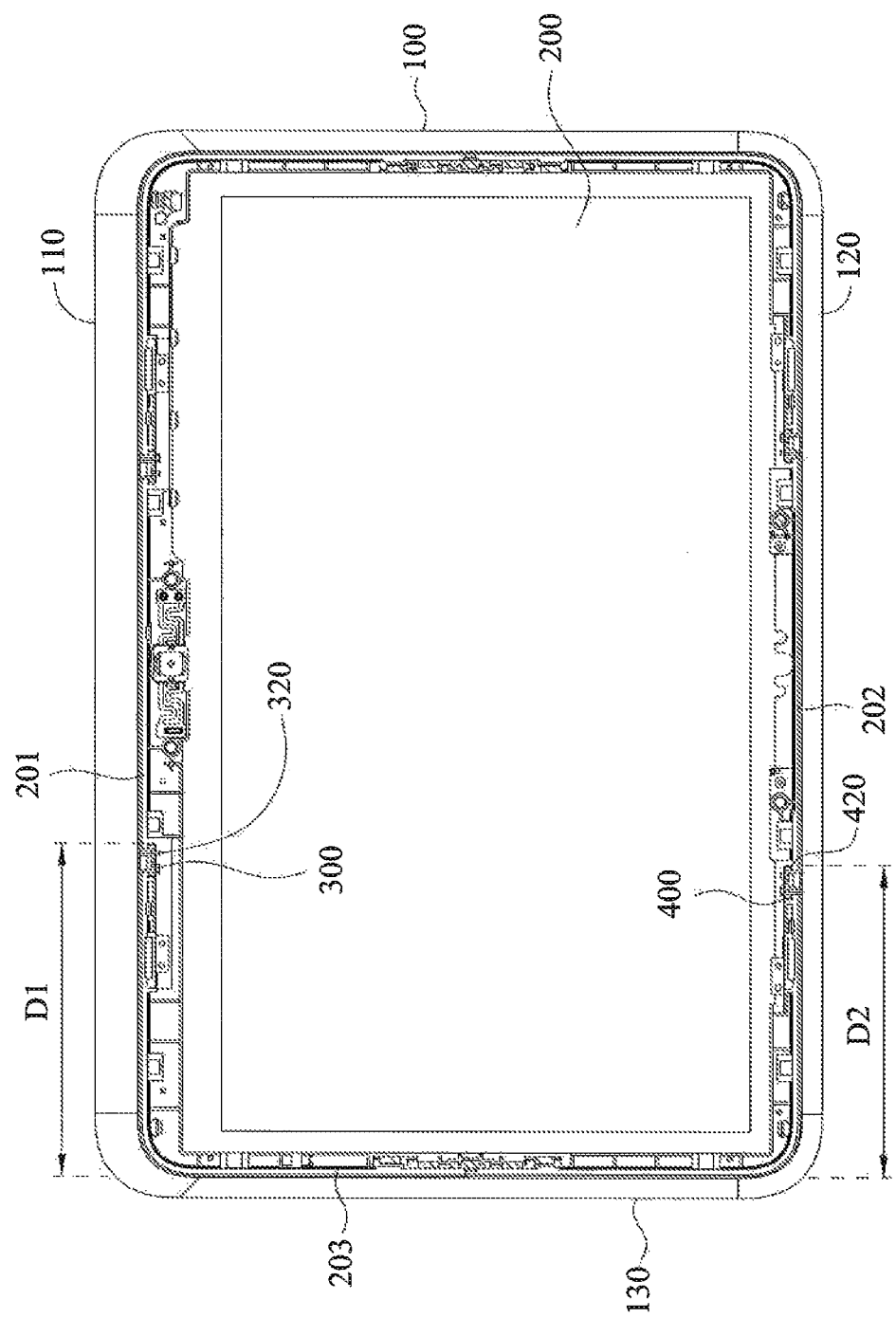
FIG. 2 is a top view of the interior of the electronic apparatus shown in FIG. 1.

FIG. 2 is a top view of the interior of the electronic apparatus shown in FIG. 1. As shown in FIG. 2, the electronic apparatus includes a first wedging mechanism 300 and a second wedging mechanism 400. The first wedging mechanism 300 includes a first wedging structure 320, and the second wedging mechanism 400 includes a second wedging structure 420. The first wedging structure 320 is disposed on the first edge 201 of the display module 200, and the second wedging structure 420 is disposed on the second edge 202 of the display module 200. The first wedging structure 320 and the third edge 203 of the display module 200 define a first distance D1 therebetween. The second wedging structure 420 and the third edge 203 define a second distance D2 therebetween. The first distance D1 is different from the second distance D2. In other words, the first wedging structure 320 and the second wedging structure 420 are misaligned, and therefore, after the display module 200 reverses, the position that the first wedging structure 320 wedges on the first frame stick 110 can deviate from the position that the second wedging structure 420 wedges on the first frame stick 110 before reversing. Similarly, after the display module 200 reverses, the position that the second wedging structure 420 wedges on the second frame stick 120 can deviate from the position that the first wedging structure 320 wedges on the second frame stick 120 before reversing. It is understood that the term "reverse" refers that an object turns completely about in position or direction.

In some embodiments, as shown in FIG. 2, the position that the second wedging structure 420 is projected to the first edge 201 is spatially separated from the first wedging structure 320, so as to misalign more completely.

Figure 3:
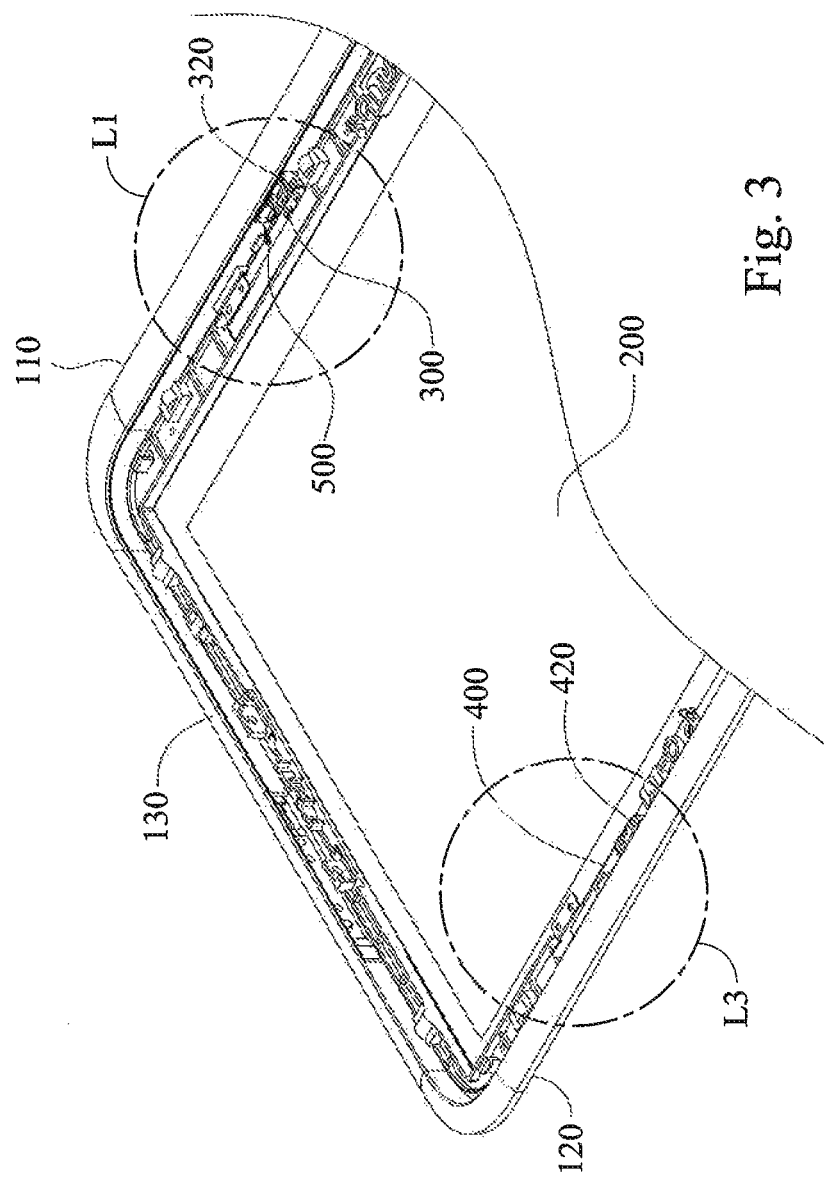
FIG. 3 is a fragmentary perspective view of the electronic apparatus shown in FIG. 2.

FIG. 3 is a fragmentary perspective view of the electronic apparatus shown in FIG. 2. As shown in FIG. 3, the electronic apparatus includes a first blocking part 500. The first blocking part 500 is disposed on the first frame stick 110. In this figure, the first wedging structure 320 is wedged in the first blocking part 500. After the display module 200 reverses, the second wedging structure 420 can also be wedged in the first blocking part 500. Because the first wedging structure 320 and the second wedging structure 420 are misaligned, the first wedging structure 320 and the second wedging structure 420 can be wedged in different positions on the first blocking part 500. Because only a first blocking part 500 is caved on the first frame stick 110, and the first wedging structure 320 and the second wedging structure 420 are disposed on the display module 200, not on the first frame stick 110, the thickness, of the first frame stick 110 can be reduced, thereby facilitating the miniaturization of the electronic apparatus.

Figure 4:
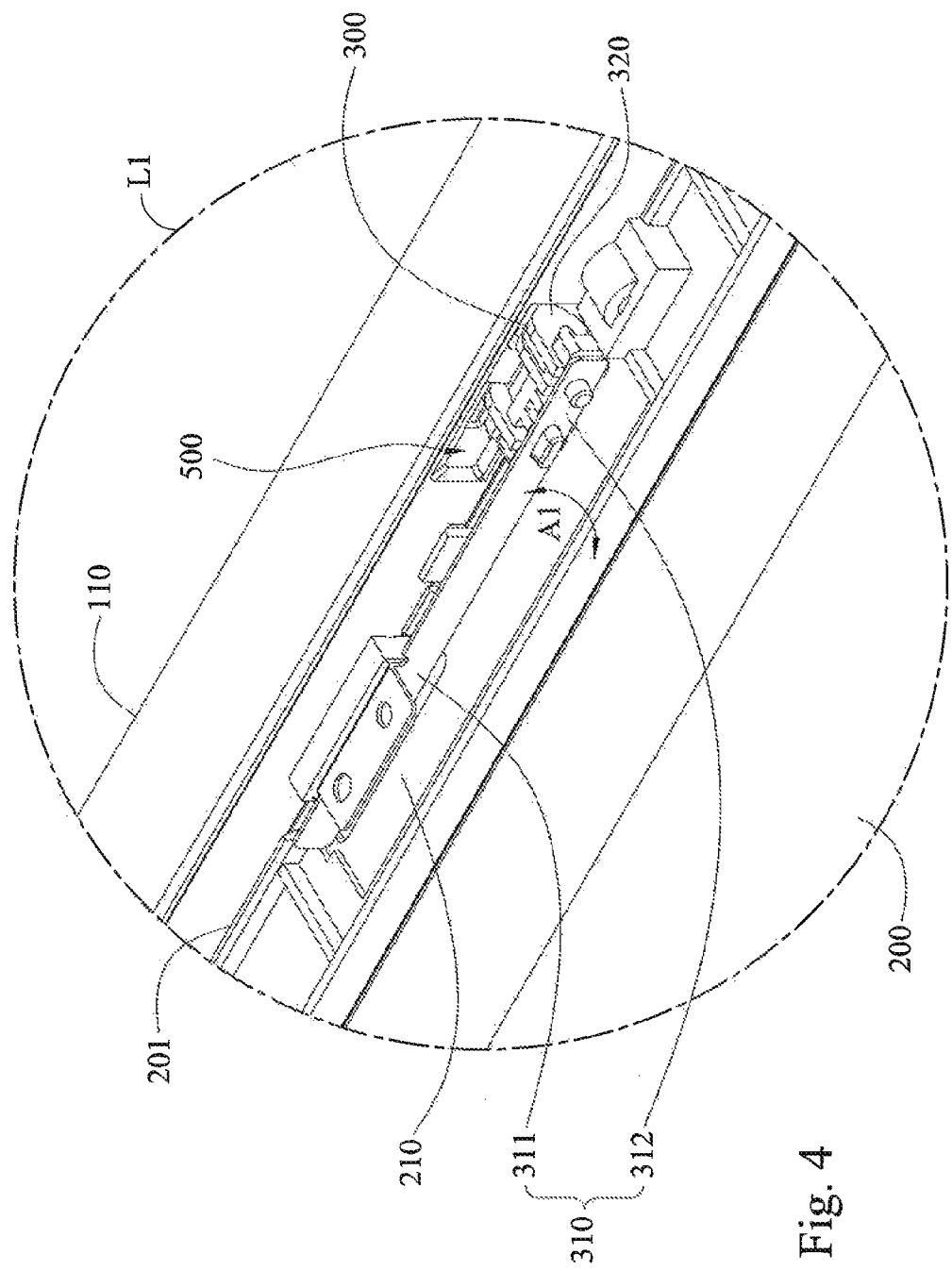
FIG. 4 is a perspective view of the partial area L1 of the electronic apparatus shown in FIG. 3.

FIG. 4 is a perspective view of the partial area L1 of the electronic apparatus shown in FIG. 3. As shown in FIG. 4, in some embodiments, the display module 200 includes a first inner frame 210 therein. The first wedging mechanism 300 includes a first elastic arm 310. The first elastic arm 310 has a first section 311 and a second section 312. The first section 311 is fixed on the first inner frame 210 of the display module 200. The second section 312 is connected to the first wedging structure 320. In particular, the material of the first elastic arm 310 can be elastic material, so that the second section 312 and the first wedging structure 320 can swing along the arrow A1.

As shown in FIG. 4, when the user would like to fix the display module 200, the display module 200 can rotate along the counterclockwise direction. At first, the first frame stick 110 contacts with and presses the first wedging structure 320, so that the first elastic arm 310 bends opposite to the first frame stick 110. When the display module 200 keeps rotating and the first wedging structure 320 arrives the first blocking part 500, the first elastic arm 310 recovers to the original shape owning to the elastic ability thereof, so that the first wedging structure 320 can be wedged in the first blocking part 500 and temporality fix the display module 200 and the first frame stick 110.

As shown in FIG. 4, when the user would like to rotate the fixed display module 200, he can press the module 200 to rotate the display module 200 along the clockwise direction. At first, the first wedging structure 320 can be pressed by the surface of the first frame stick 110, such that the first elastic arm 310 bends opposite to the first frame stick 110. When the display module 200 keeps rotating, the first wedging structure 320 can leave the first frame stick 110.

Figure 5:
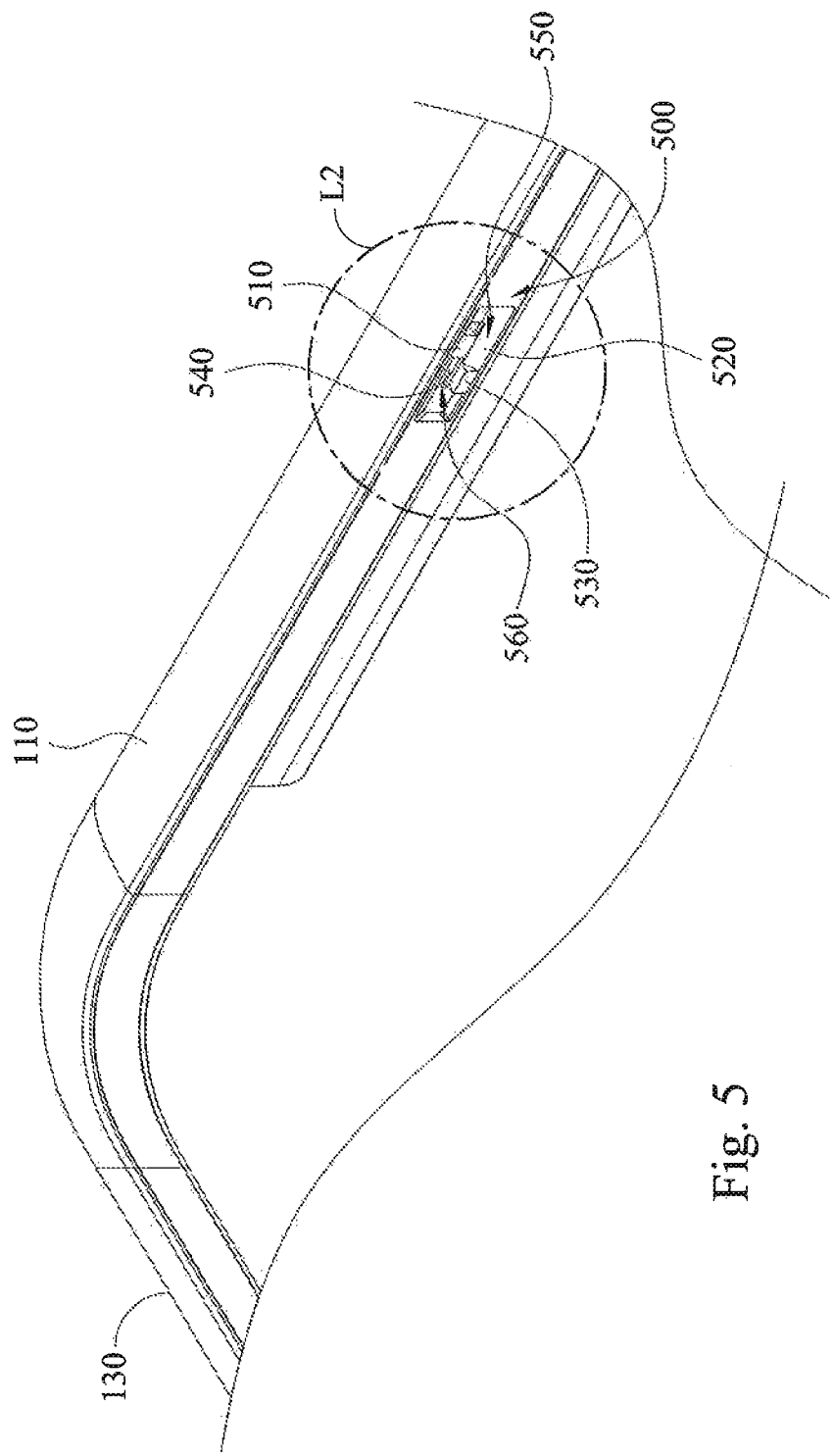
FIG. 5 is a fragmentary perspective view of the first frame stick and the third frame stick in accordance with one embodiment of the present invention.

FIG. 5 is a fragmentary perspective view of the first frame stick 110 and the third frame stick 130 in accordance with one embodiment of the present invention. As shown in FIG. 5, in some embodiments, the first blocking part 500 includes a first blocking body 510, a first guiding surface 520, a second blocking body 530 and a second guiding surface 540. The first guiding surface 520 is spatially separated from the first blocking body 510. The first guiding surface 520 and the first blocking body 510 define a first blocking groove 550 therebetween. The second guiding surface 540 is spatially from the second blocking body 530. The second guiding surface 540 and the second blocking body 530 define a second blocking groove 560 therebetween. The second blocking groove 560 is closer to the third frame stick 130 than the first blocking groove 550 is. In other words, the first blocking groove 550 and the second blocking groove 560 are misaligned, so that the first blocking groove 550 can block and secure the first wedging structure 320 (See FIG. 4), and the second blocking groove 560 can block and secure the second wedging structure 420 (See FIG. 3) misaligned with the first wedging structure 320.

Figure 6:
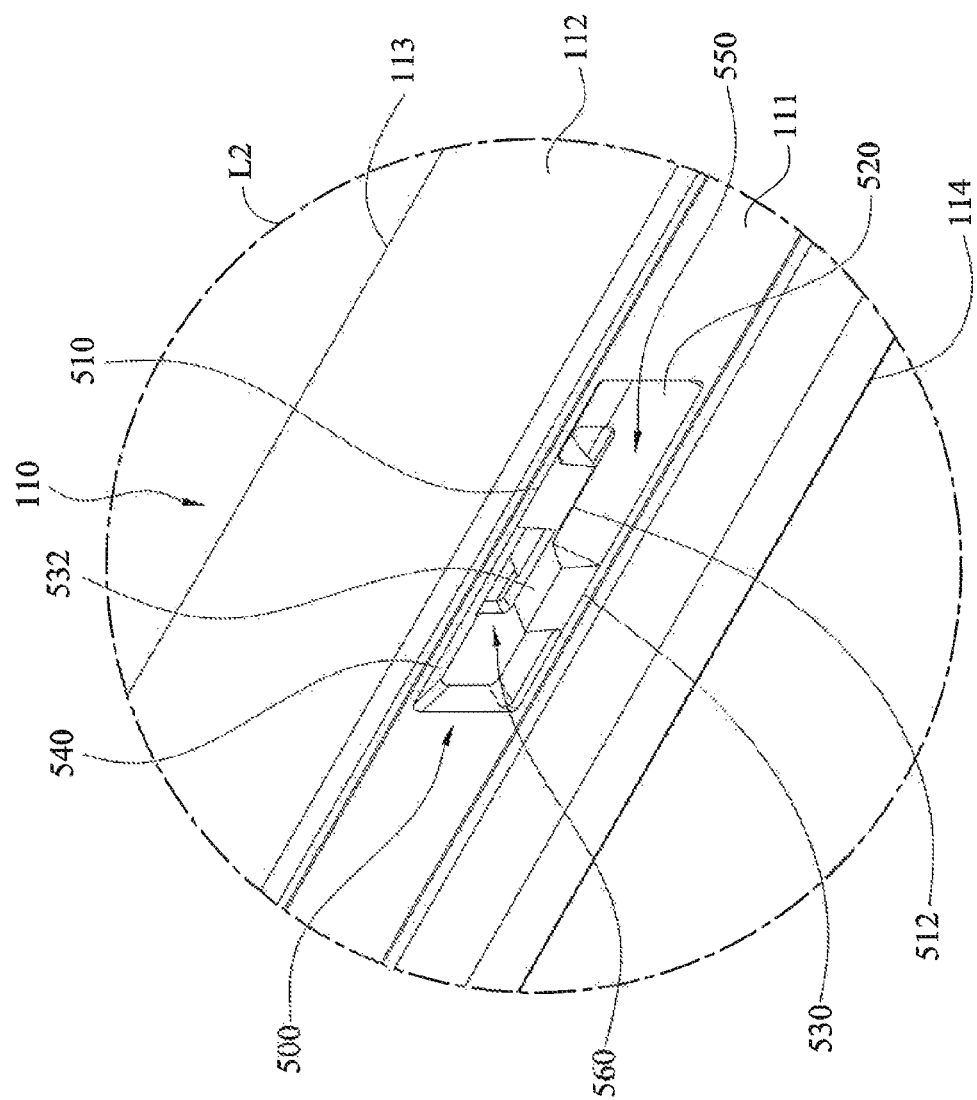
FIG. 6 is a perspective view of the partial area L2 shown in FIG. 5.

FIG. 6 is a perspective view of the partial area L2 shown in FIG. 5. As shown in FIG. 6, in some embodiments, the first frame stick 110 includes a first inner surface 111, a first top surface 112, a first outer surface 113 and a first bottom surface 114 connected sequentially. The first blocking part 500 is disposed on the first inner surface 111. In other words, the first blocking part 500 is a concave structure caved on the first inner surface 111. The second blocking body 530 is farther from the first top surface 112 than the first blocking body 510 is. In other words, the first blocking body 510 is closer to the first top surface 112, and the second blocking body 530 is closer to the first bottom surface 114. Further, the first guiding surface 520 is slanted from the first inner surface 111 toward the first outer surface 113 and the first top surface 112, and the second guiding surface 540 is slanted from the first inner surface 111 toward the first outer surface 113 and the first bottom surface 114. The second guiding surface 540 is closer to the first top surface 112 than the first guiding surface 520 is. In other words, the first guiding surface 520 is closer to the first bottom surface 114, and the second guiding surface 540 is closer to the first top surface 112.

Therefore, the first wedging structure 320 (See FIG. 4) can rotate into the first blocking groove 550 along the direction from the first bottom surface 114 toward the first top surface 112, and it can slide on the first guiding surface 520 and be blocked by the first blocking body 510. The second wedging structure 420 (See FIG. 3) can rotate into the second blocking groove 560 along the direction from the first top surface 112 toward the first bottom surface 114, and it can slide on the second guiding surface 540 and be blocked by the second blocking body 530. In other words, the first wedging structure 320 and the second wedging structure 420 can rotate along different directions and can be respectively wedged in the first blocking groove 550 and the second blocking groove 560. Therefore, the user can only reverse the display module 200 (See FIG. 1), and cannot rotate the display module 200 over 180 degrees.

In some embodiments, as shown in FIG. 6, the first blocking body 510 has a first blocking surface 512 facing to the first guiding surface 520. The first blocking surface 512 can press against the first wedging structure 320 of the first wedging mechanism 300 (See FIG. 4), so that the first wedging structure 320 can be temporarily secured in the first blocking groove 550. Similarly, the second blocking body 530 has a second blocking surface 532 facing to the second guiding surface 540. The second blocking surface 532 can press against the second wedging structure 420 (See FIG. 3), so that the second wedging structure 420 can be temporarily secured in the second blocking groove 560.

Figure 7:
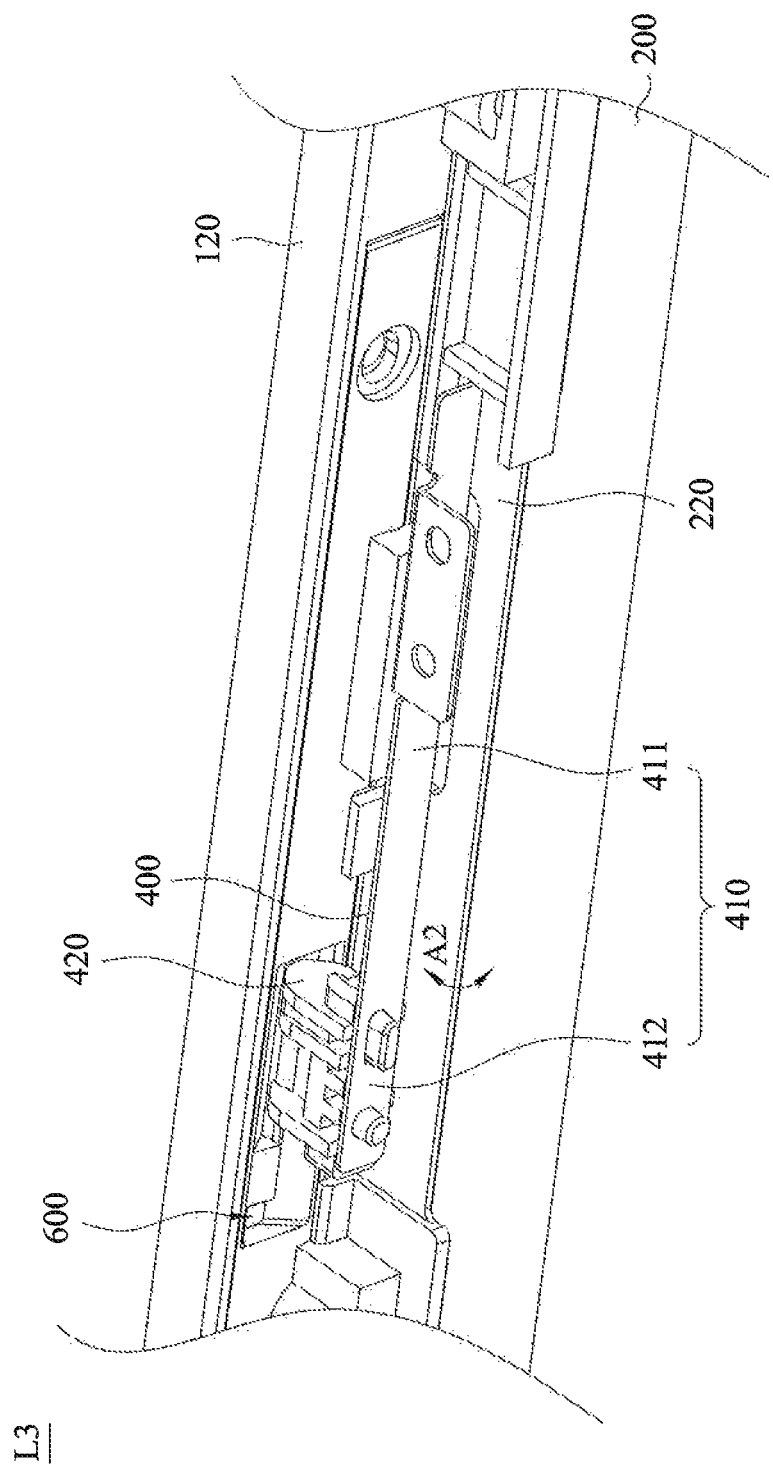
FIG. 7 is a perspective view of the partial area L3 shown in FIG. 3.

FIG. 7 is a perspective view of the partial area L3 shown in FIG. 3. As shown in FIG. 7, in some embodiments, the electronic apparatus includes a second blocking part 600. The second blocking part 600 is disposed on the second frame stick 120. In this figure, the second wedging structure 420 is wedged in the second blocking part 600. When the display module 200 reverses, the first wedging structure 320 (See FIG. 3) can also be wedged in the second blocking part 600. Further, because the first wedging structure 320 and the second wedging structure 420 are misaligned, the first wedging structure 320 and the second wedging 420 can be wedged in different positions of the second blocking part 600. Because only a second blocking part 600 is caved on the second frame stick 120, and the first wedging structure 320 and the second wedging structure 420 are disposed on the display module 200, not on the second frame stick 120, the thickness of the second frame stick 120 can be reduced, thereby facilitating the miniaturization of the electronic apparatus.

In some embodiments, as shown in FIG. 7, the display module 200 includes a second inner frame 220 therein. The second wedging mechanism 400 includes a second elastic arm 410. The second elastic arm 410 has a third section 411 and a fourth section 412. The third section 411 is fixed on the second inner frame 220 of the display module 200. The fourth section 412 is connected to the second wedging structure 420. In particular, the material of the second elastic arm 410 can be elastic material, so that the fourth section 412 and the second wedging structure 420 can swing along the arrow A2.

As shown in FIG. 7, when the user would like to fix the display module 200, the display module 200 can rotate along the clockwise direction. At first, the second frame stick 120 contacts with and presses the second wedging structure 420, so that the second elastic arm 410 bends opposite to the second frame stick 120. When the display module 200 keeps rotating and the second wedging structure 420 arrives the second blocking part 600, the second elastic arm 410 recovers to the original shape owning to the elastic ability thereof, so that the second wedging structure 420 can be wedged in the first blocking part 600 and temporality fix the display module 200 and the second frame stick 120.

As shown in FIG. 7, when the user would like to rotate the fixed display module 200, he can press the module 200 to rotate the display module 200 along the counterclockwise direction. At this stage, the second wedging structure 420 can be pressed by the surface of the second frame stick 120, such that the second elastic arm 410 bends opposite to the second frame stick 120. When the display module 200 keeps rotating, the second wedging structure 420 can leave the second frame stick 120.

Figure 8:
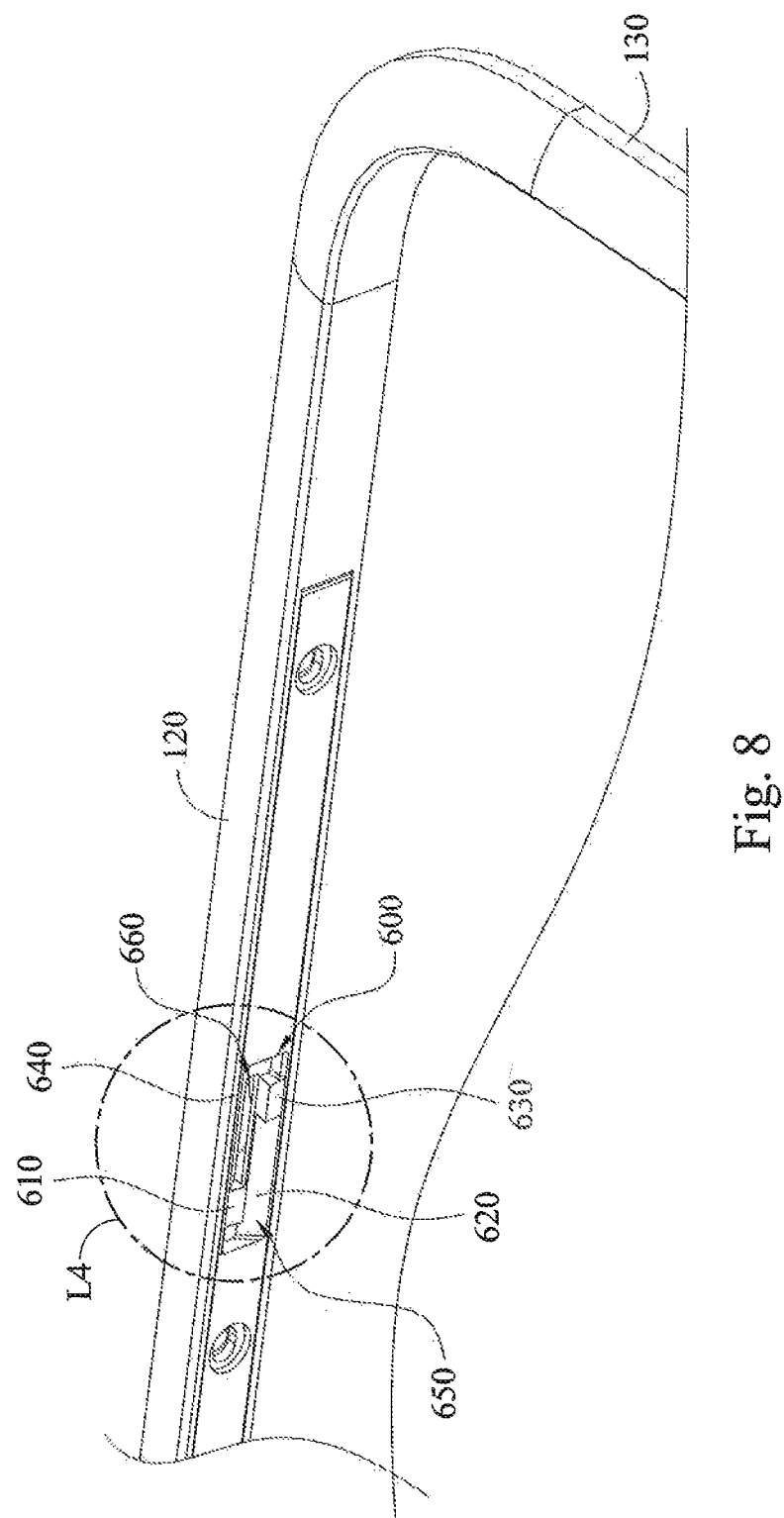
FIG. 8 is a fragmentary perspective view of the second frame stick and the third frame stick in accordance with one embodiment of the present invention.

FIG. 8 is a fragmentary perspective view of the second frame stick 120 and the third frame stick 130 in accordance with one embodiment of the present invention. As shown in FIG. 8, in some embodiments, the second blocking part 600 includes a third blocking body 610, a third guiding surface 620, a fourth blocking body 630 and a fourth guiding surface 640. The third guiding surface 620 is spatially separated from the third blocking body 610. The third guiding surface 620 and the third blocking body 610 define a third blocking groove 650 therebetween. The fourth guiding surface 640 is spatially from the fourth blocking body 630. The fourth guiding surface 640 and the fourth blocking body 630 define a fourth blocking groove 660 therebetween. The fourth blocking groove 660 is closer to the third frame stick 130 than the third blocking groove 650 is. In other words, the third blocking groove 650 and the fourth blocking groove 660 are misaligned, so that the third blocking groove 650 can block and secure the first wedging structure 320 (See FIG. 3), and the fourth blocking groove 660 can block and secure the second wedging structure 420 (See FIG. 7) misaligned with the first wedging structure 320.

Figure 9:
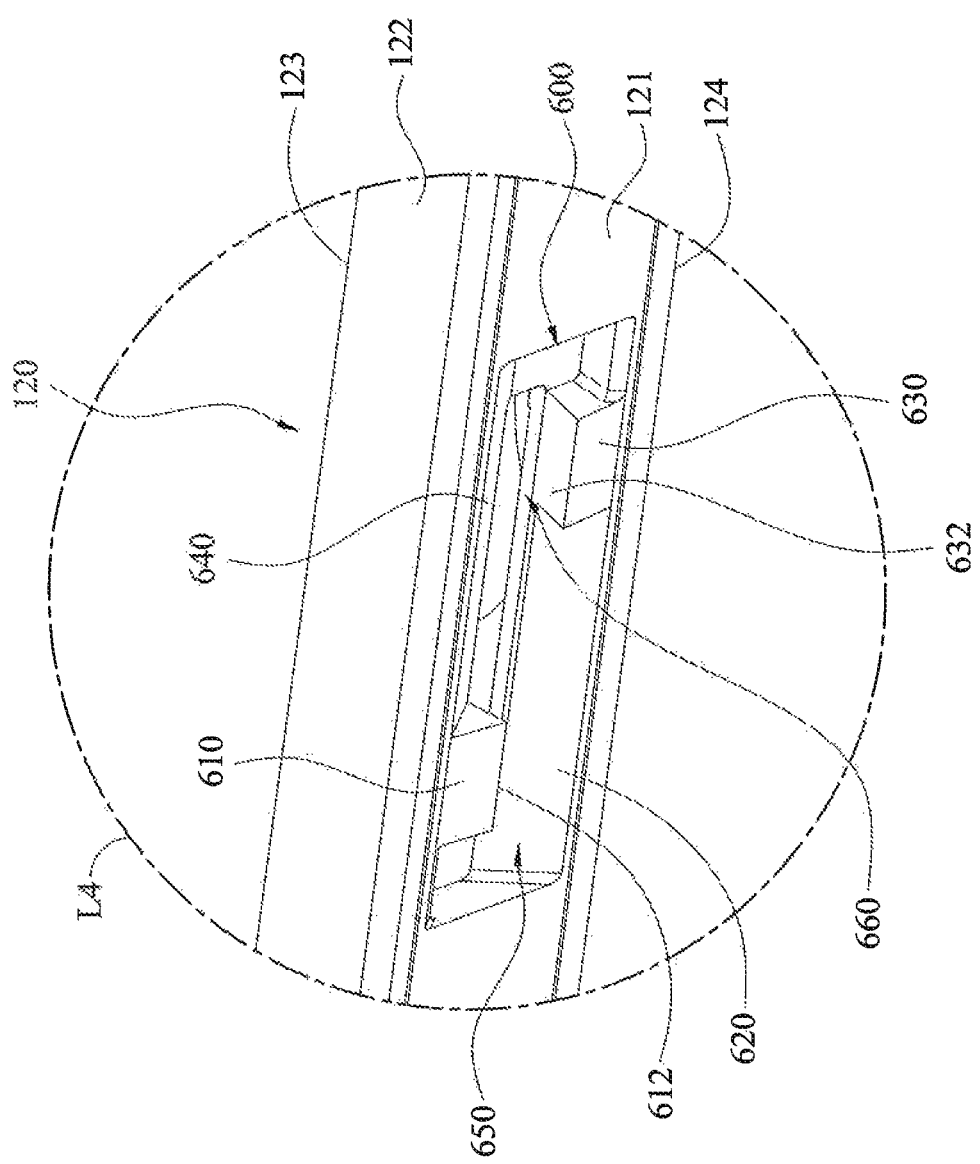
FIG. 9 is a perspective view of the partial area L4 shown in FIG. 8.

FIG. 9 is a perspective view of the partial area L4 shown in FIG. 8. As shown in FIG. 9, in some embodiments, the second frame stick 120 includes a second inner surface 121, a second top surface 122, a second outer surface 123 and a second bottom surface 124 connected sequentially. The second blocking part 600 is disposed on the second inner surface 121. In other words, the second blocking part 600 is a concave structure caved on the second inner surface 121. The fourth blocking body 630 is farther from the second top surface 122 than the third blocking body 610 is. In other words, the third blocking body 610 is closer to the second top surface 122, and the fourth blocking body 630 is closer to the second bottom surface 124. Further, the third guiding surface 620 is slanted from the second inner surface 121 toward the second outer surface 123 and the second top surface 122, and the fourth guiding surface 640 is slanted from the second inner surface 121 toward the second outer surface 123 and the second bottom surface 124. The fourth guiding surface 640 is closer to the second top surface 122 than the third guiding surface 620 is. In other words, the third guiding surface 620 is closer to the second bottom surface 124, and the fourth guiding surface 640 is closer to the second top surface 122.

Therefore, the second wedging structure 420 (See FIG. 7) can rotate into the fourth blocking groove 660 along the direction from the second top surface 122 toward the second bottom surface 124, and it can slide on the fourth guiding surface 640 and be blocked by the fourth blocking body 630. The first wedging structure 320 (See FIG. 3) can rotate into the third blocking groove 650 along the direction from the second bottom surface 124 toward the second top surface 122, and it can slide on the third guiding surface 620 and be blocked by the third blocking body 610. In other words, the first wedging structure 320 and the second wedging structure 420 can rotate along different directions and can be respectively wedged in the third blocking groove 650 and the fourth blocking groove 660. Therefore, the user can only reverse and fix the display module 200 (See FIG. 1), and cannot rotate the display module 200 over 180 degrees.

In some embodiments, as shown in FIG. 9, the third blocking body 610 has a third blocking surface 612 facing to the third guiding surface 620. The third blocking surface 612 can press against the first wedging structure 320 of the first wedging mechanism 300 (See FIG. 4), so that the first wedging structure 320 can be temporarily secured in the third blocking groove 650. Similarly, the fourth blocking body 630 has a fourth blocking surface 632 facing to the fourth guiding surface 640. The fourth blocking surface 632 can press against the second wedging structure 420 (See FIG. 7), so that the second wedging structure 420 can be temporarily secured in the fourth blocking groove 660.

Figure 10:
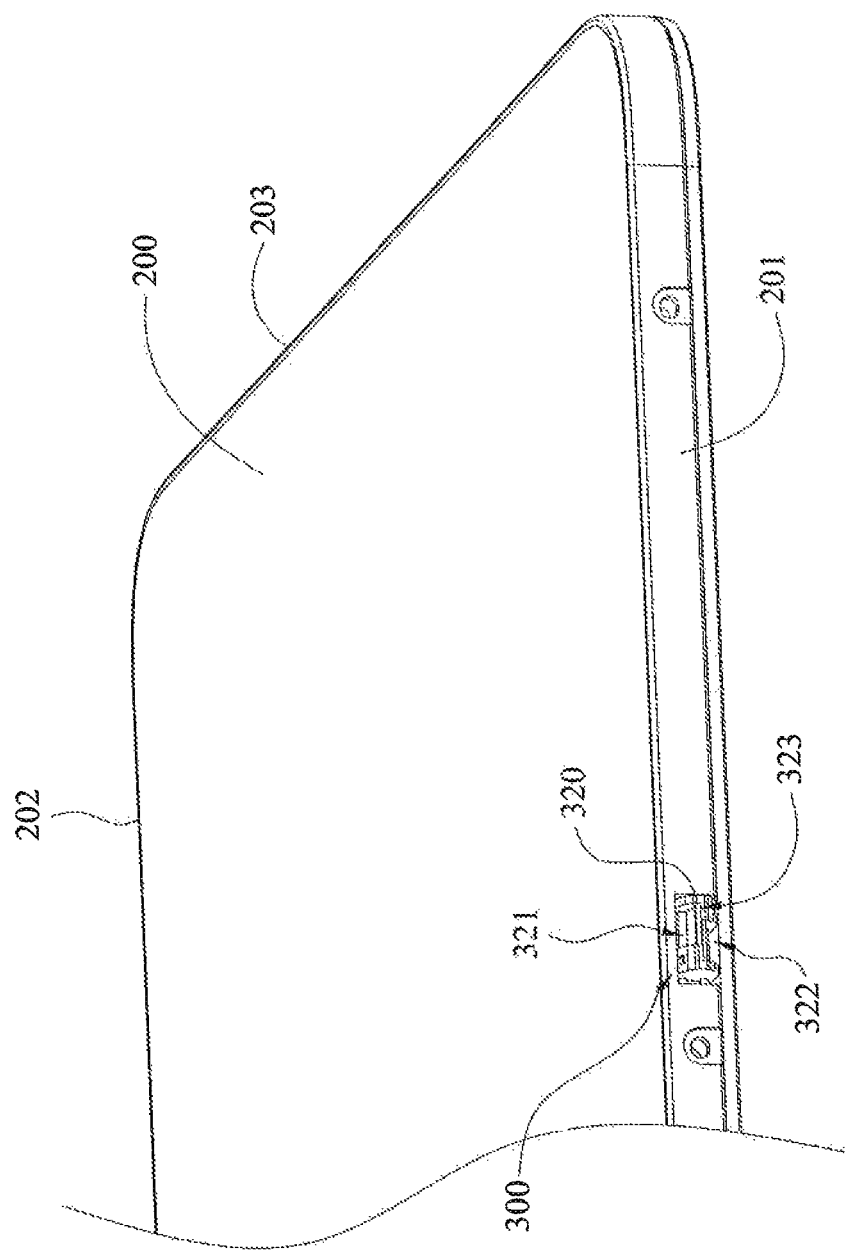
FIG. 10 is a perspective view of the display module in accordance with one embodiment of the present invention.

FIG. 10 is a perspective view of the display module 200 in accordance with one embodiment of the present invention. As shown in FIG. 10, the first wedging structure 320 is exposed by one hole on the first edge 201. The first wedging structure 320 includes a first wedging groove 321, a second wedging groove 322 and a first guiding rib 323. The first wedging groove 321 and the second wedging groove 322 are respectively positioned on opposite sides of the first guiding rib 323. The first wedging groove 321 is aligned with the first blocking body 510 (See FIG. 6) of the first blocking part 500, so that the first wedging groove 321 can be wedged with the first blocking body 510 of the first to blocking part 500 when the first edge 201 adjoins the first frame stick 110 (See FIG. 6). The second wedging groove 322 is aligned with the third blocking body 610 (See FIG. 6) of the second blocking part 600, so that the second wedging groove 322 can be wedged with the third blocking body 610 of the second blocking part 600 when the first edge 201 adjoins the second frame stick 120 (See FIG. 9).

In some embodiments, as shown in FIG. 10, the first wedging groove 321 is closer to the third edge 203 than the second wedging groove 322. In other words, the first wedging groove 321 and the second wedging groove 322 are misaligned. Similarly, the first blocking body 510 (See FIG. 6) and the third blocking body 610 (See FIG. 9) are also misaligned, so that they can be respectively wedged in the first wedging groove 321 and the second wedging groove 322.

Figure 11:
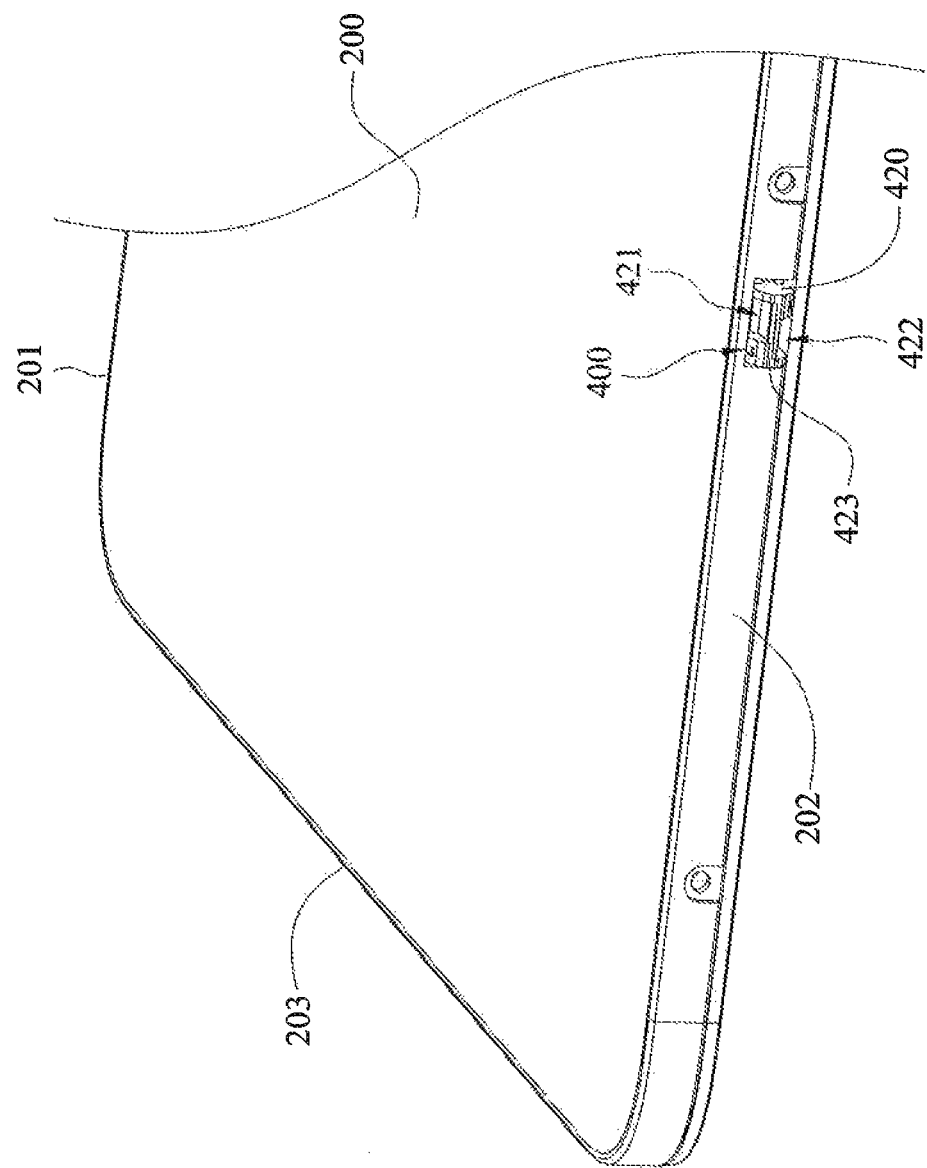
FIG. 11 is a perspective view of the electronic apparatus in accordance with one embodiment of the present invention.

FIG. 11 is a perspective view of the electronic apparatus in accordance with one embodiment of the present invention. As shown in FIG. 11, the second wedging structure 420 includes a third wedging groove 421, a fourth wedging groove 422 and a second guiding rib 423. The third wedging groove 421 and the fourth wedging groove 422 are respectively positioned on opposite sides of the second guiding rib 423. The fourth wedging groove 422 is aligned with the fourth blocking body 630 (See FIG. 6) of the second blocking part 600, so that the fourth wedging groove 422 can be wedged with the fourth blocking body 630 when the second edge 202 adjoins the second frame stick 120 (See FIG. 9). The third wedging groove 421 is aligned with the second blocking body 530 (See FIG. 6) of the first blocking part 500, so that the third wedging groove 421 can be wedged with the second blocking body 530 when the second edge 202 adjoins the first frame stick 110 (See FIG. 6).

In some embodiments, as shown in FIG. 11, the third wedging groove 421 is closer to the third edge 203 than the fourth wedging groove 422. In other words, the third wedging groove 421 and the fourth wedging groove 422 are misaligned. Similarly, the third blocking body 530 (See FIG. 6) and the fourth blocking body 630 (See FIG. 9) are also misaligned, so that they can be respectively wedged in the third wedging groove 421 and the fourth wedging groove 422.

Figure 12:
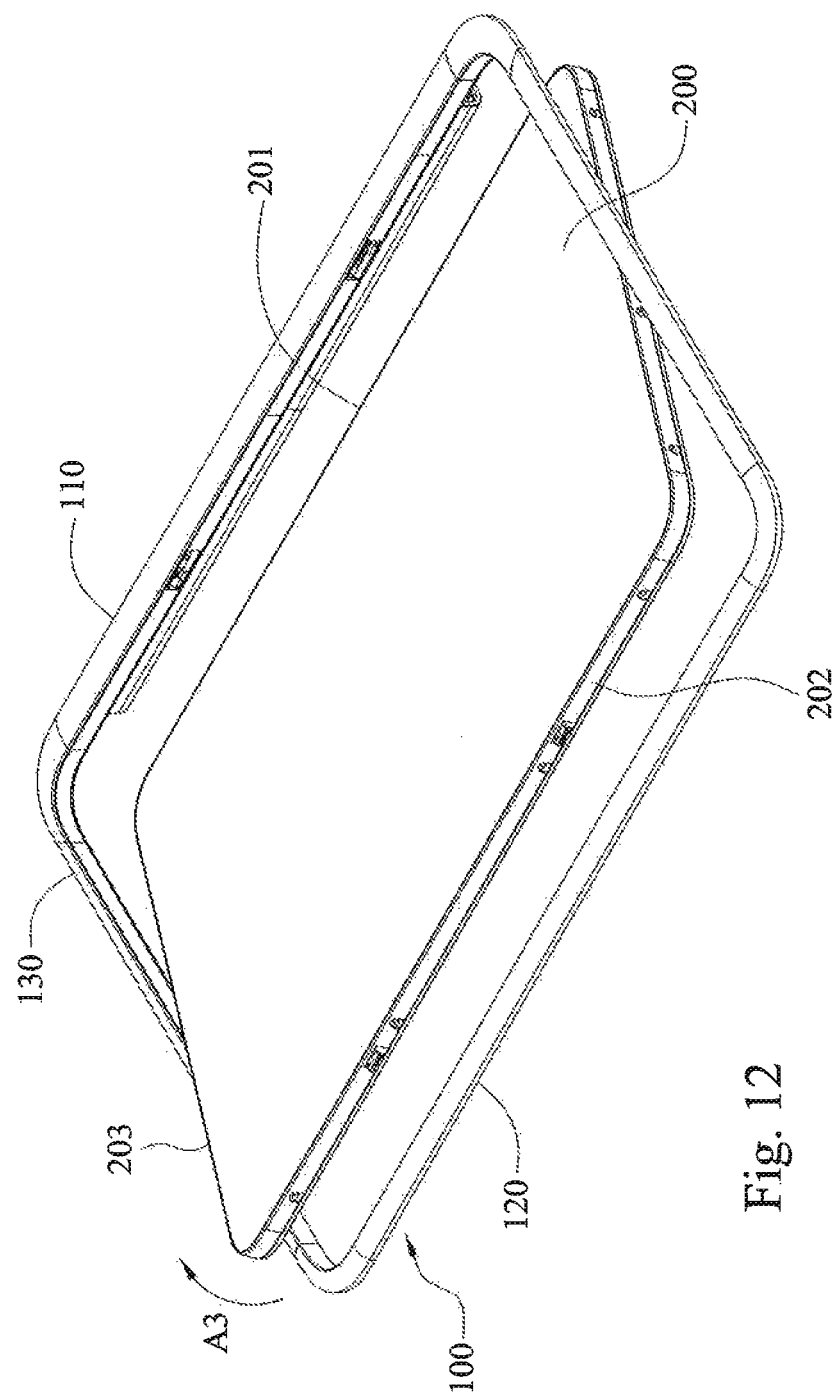
FIGS. 12 and 13 are perspective views of two transient states when the display module is rotating.
Figure 13:
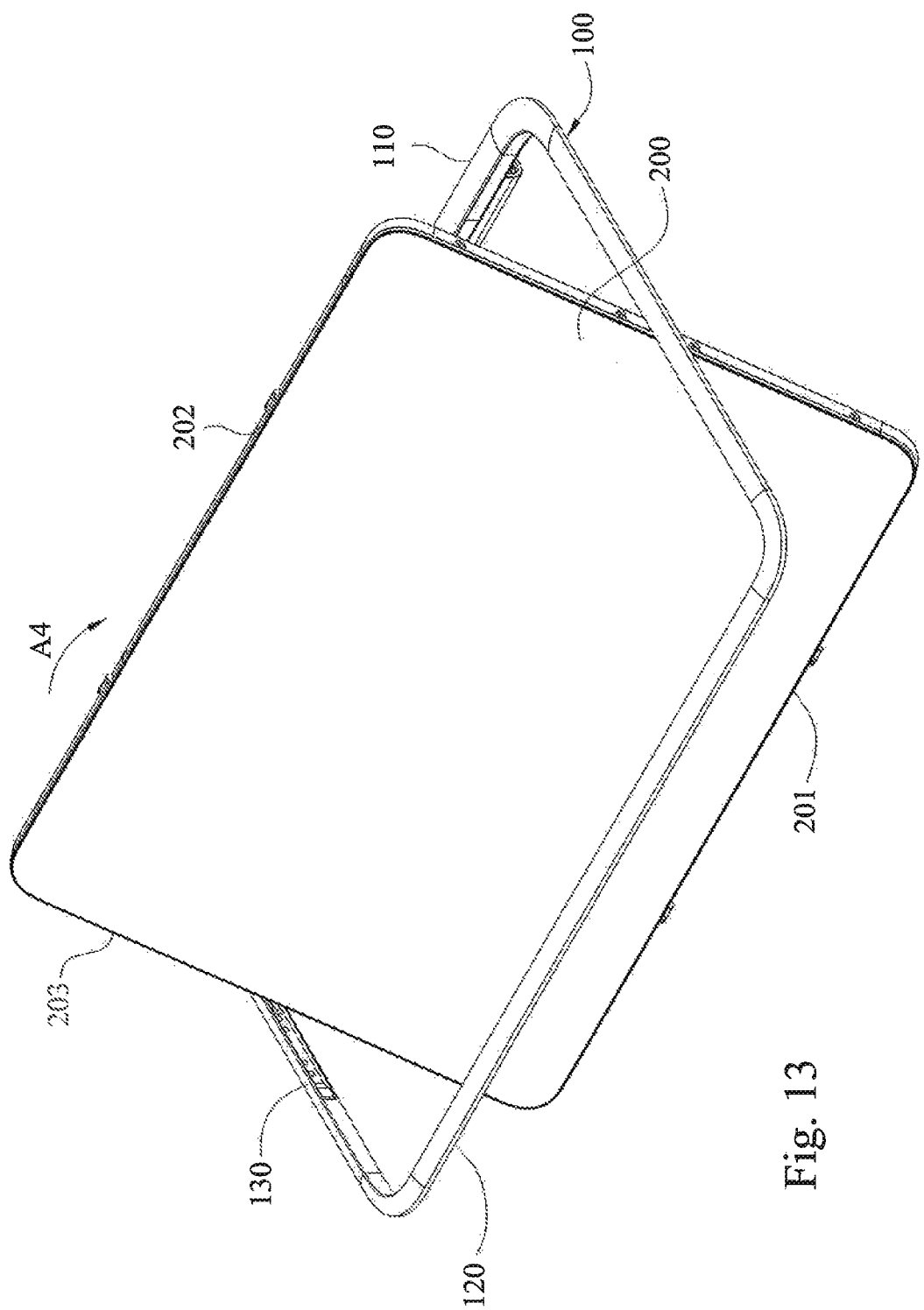

FIGS. 12 and 13 are perspective views of two transient states when the display module 200 is rotating. As shown in FIG. 12, the user can push the display module 200 to rotate the display module 200 along the arrow A3. At this stage, the first edge 201 rotates toward the lower region below the first frame stick 110, and the second edge 202 rotates toward the upper region above the second frame stick 120. As shown in FIG. 13, when the display module 200 keeps rotating along the arrow A4, the first edge 201 can rotate toward the second frame stick 120, and the second edge 202 can rotate toward the firs frame stick 110.

Figure 14:
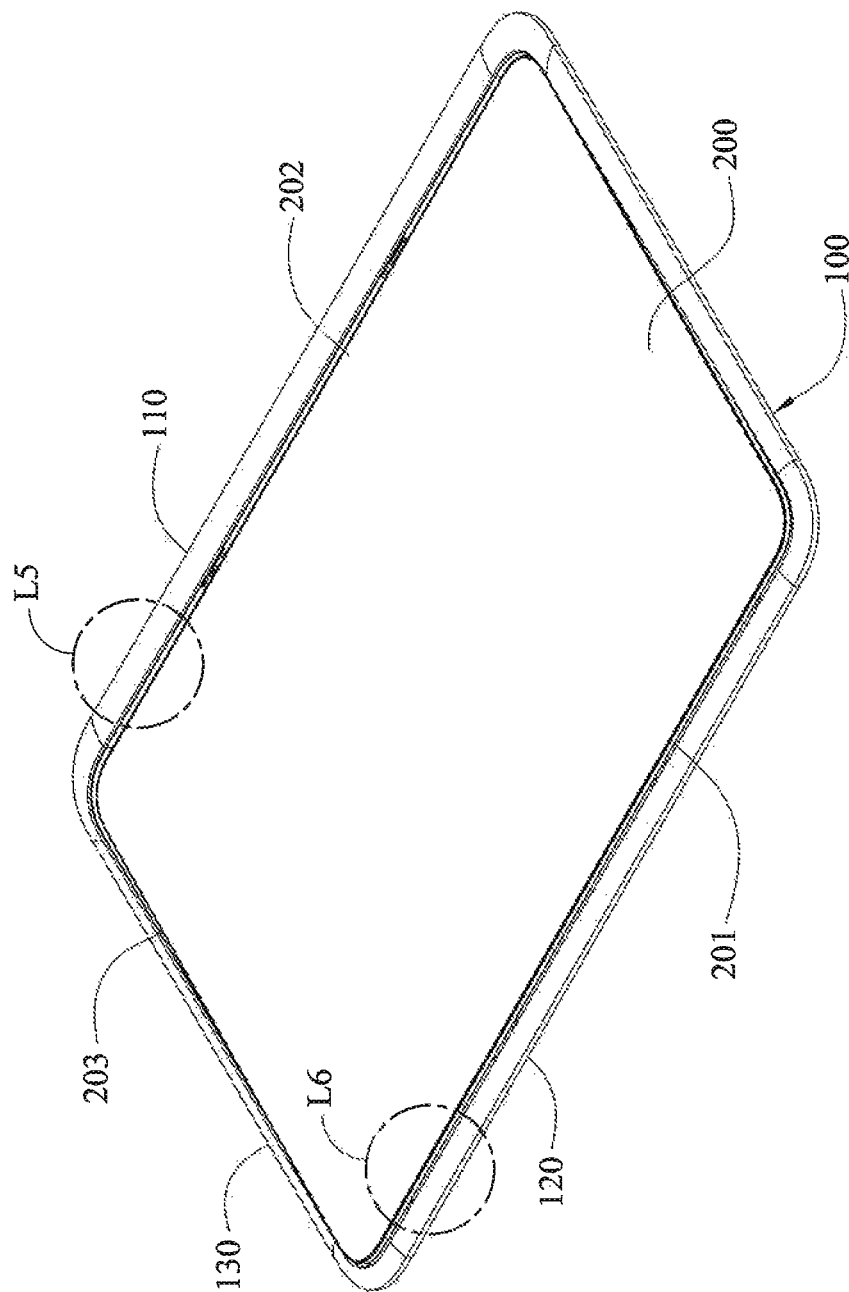
FIG. 14 is a perspective view of the reversed electronic apparatus in accordance with one embodiment of the present invention.
Figure 15:
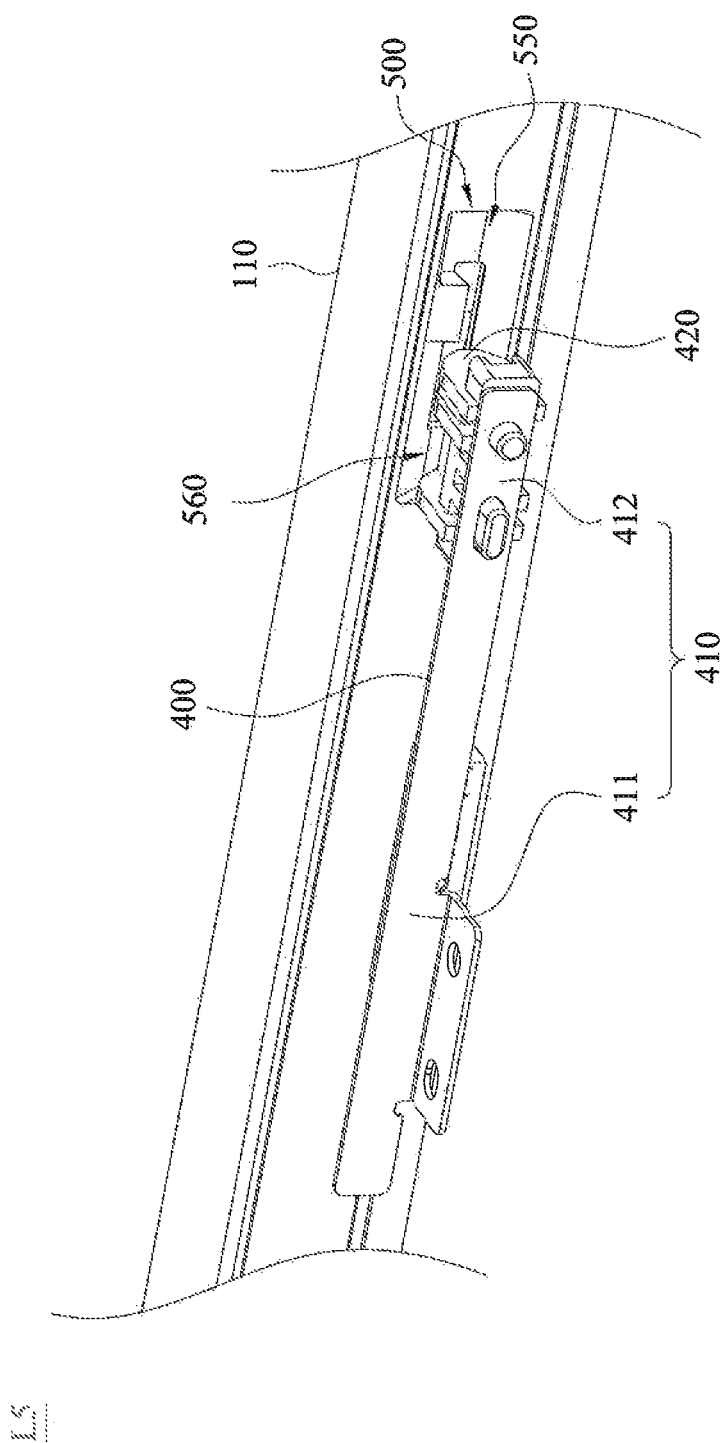
FIG. 15 is a perspective view of the partial area L5 shown in FIG. 14.
Figure 16:
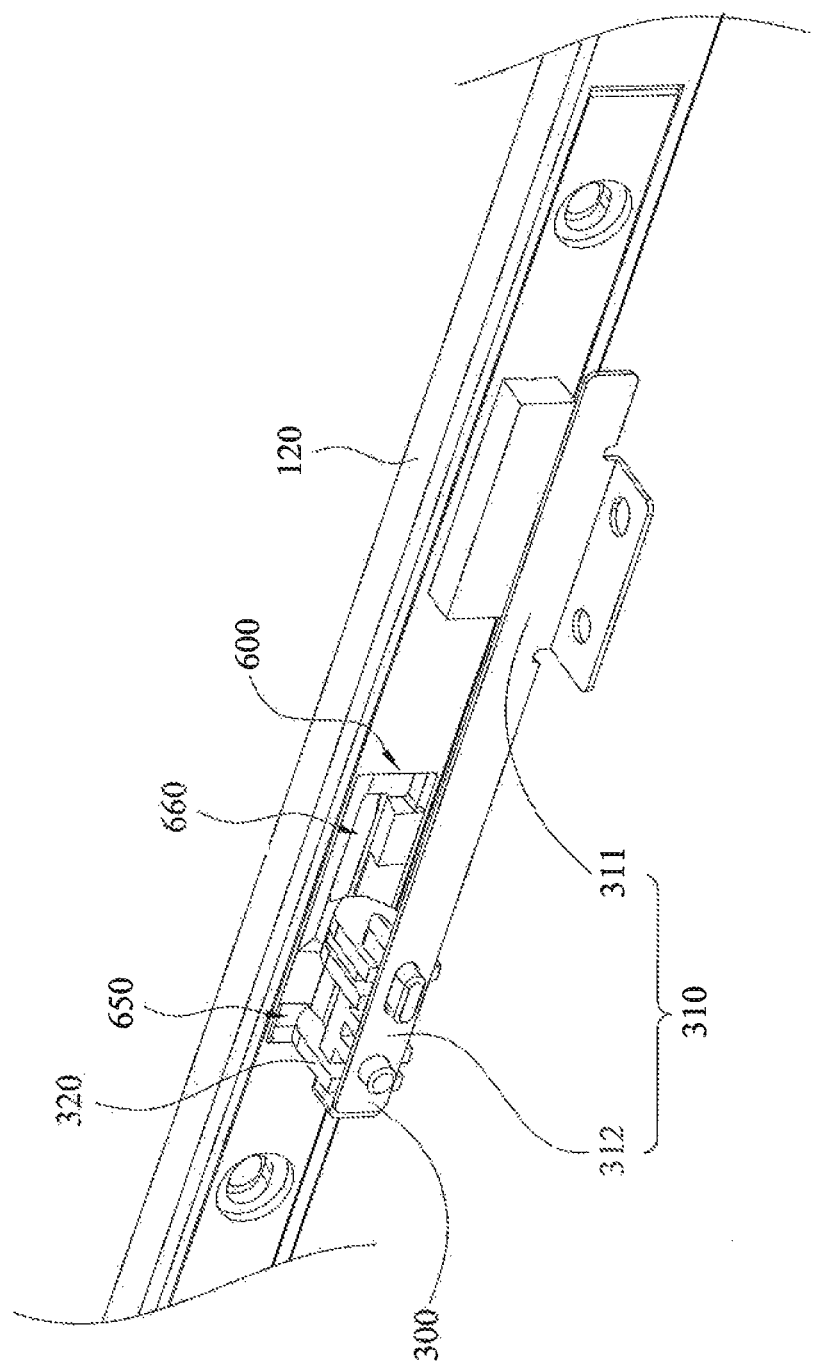
FIG. 16 is a perspective view of the partial area L6 shown in FIG. 14.

FIG. 14 is a perspective view of the reversed electronic apparatus in accordance with one embodiment of the present invention. As shown in FIG. 14, when the display module 200 is reversed, the first edge 201 adjoins the second frame stick 120, and the second edge 202 adjoins the first frame stick 110. This state is opposite to which is shown in FIG. 1. FIG. 15 is a perspective view of the partial area L5 shown in FIG. 14. As shown in FIG. 15, the second wedging structure 420 is wedged with the first blocking part 500 on the first to frame stick 110. In particular, the second wedging structure 420 is wedged in the second blocking groove 560. FIG. 16 is a perspective view of the partial area L6 shown in FIG. 14. As shown in FIG. 16, the first wedging structure 320 is wedged with the second blocking part 600 on the second frame stick 120. In particular, the first wedging structure 320 is wedged in the third blocking groove 650.

In aforementioned embodiments, although only one first wedging structure 320, one second wedging structure 420, one first blocking part 500 and one blocking part 600 are shown, but in other embodiments, plural first wedging structures 320, plural second wedging structures 420, plural first blocking parts 500 and plural blocking parts 600 can be employed, so as to secure the display module 200 on the frame 100 in such a steadier manner.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic apparatus, comprising:
  a frame comprising a first frame stick, a second frame stick and at least one third frame stick connecting the first frame stick and the second frame stick;
  a first blocking part disposed on the first frame stick;
  a second blocking part disposed on the second frame stick;
  a display module comprising a first edge, a second edge and at least one third edge, wherein the third edge is pivotally connected to the third frame stick;
  a first wedging structure disposed on the first edge for wedging the first blocking part or the second blocking part, wherein the first wedging structure and the third edge define a first distance therebetween; and
  a second wedging structure disposed on the second edge of the display module for wedging the first blocking part or the second blocking part, wherein the second wedging structure and the third edge define a second distance therebetween, wherein the first distance is different from the second distance.

2. The electronic apparatus of claim 1, wherein the first blocking part comprises:
  a first blocking body;
  a first guiding surface spatially separated from the first blocking body, and the first guiding surface and the first blocking body define a first blocking groove therebetween, wherein the first blocking groove is used to secure the first wedging structure;
  a second blocking body; and
  a second guiding surface spatially from the second blocking body, and the second guiding surface and the second blocking body define a second blocking groove therebetween, wherein the second blocking groove is used to secure the second wedging structure, wherein the second blocking groove is closer to the third frame stick than the first blocking groove is.

3. The electronic apparatus of claim 2, wherein the first frame stick comprises a first inner surface, a first top surface, a first outer surface and a first bottom surface connected sequentially, wherein the first blocking part is disposed on the first inner surface, and the second blocking body is farther from the first top surface than the first blocking body is.

4. The electronic apparatus of claim 3, wherein the first guiding surface is slanted from the first inner surface toward the first outer surface and the first top surface, wherein the second guiding surface is slanted from the first inner surface toward the first outer surface and the first bottom surface, wherein the second guiding surface is closer to the first top surface than the first guiding surface is.

5. The electronic apparatus of claim 1, wherein the second blocking part comprises:
    a third blocking body;
    a third guiding surface spatially separated from the third blocking body, and the third guiding surface and the third blocking body define a third blocking groove therebetween, wherein the third blocking groove is used to secure the first wedging structure;
    a fourth blocking body; and
    a fourth guiding surface spatially separated from the fourth blocking body, and the fourth guiding surface and the fourth blocking body define a fourth blocking groove therebetween, wherein the fourth blocking groove is used to secure the second wedging structure, wherein the fourth blocking groove is closer to the third frame stick than the third blocking groove is.

6. The electronic apparatus of claim 5, wherein the second frame stick comprises a second inner surface, a second top surface, a second outer surface and a second bottom surface connected sequentially, wherein the second blocking part is disposed on the second inner surface, and the fourth blocking body is farther from the second top surface than the third blocking body is.

7. The electronic apparatus of claim 6, wherein the third guiding surface is slanted from the second inner surface toward the second outer surface and the second top surface, wherein the fourth guiding surface is slanted from the second inner surface toward the second outer surface and the second bottom surface, wherein the fourth guiding surface is closer to the second top surface than the third guiding surface is.

8. The electronic apparatus of claim 1, wherein the position that the second wedging structure is projected to the first edge is spatially separated from the first wedging structure.

9. The electronic apparatus of claim 1, further comprising:
    a first elastic arm having a first section and a second section, wherein the first section is fixed on the display module, and the second section is connected to the first wedging structure.

10. The electronic apparatus of claim 9, wherein the first wedging structure comprises:
    a first guiding rib;
    a first wedging groove positioned on one side of the first guiding rib; and
    a second wedging groove positioned on another side of the first guiding rib.

11. The electronic apparatus of claim 10, wherein the first wedging groove is closer to the third edge than the second wedging groove is.

12. The electronic apparatus of claim 1, further comprising:
    a second elastic arm having a third section and a fourth section, wherein the third section is fixed on the display module, and the fourth section is connected to the second wedging structure.

13. The electronic apparatus of claim 12, wherein the second wedging structure comprises:
    a second guiding rib;
    a third wedging groove positioned on one side of the second guiding rib; and
    a fourth wedging groove positioned on another side of the second guiding rib.

14. The electronic apparatus of claim 13, wherein the third wedging groove is farther from the third edge than the fourth wedging groove is.

* * * * *